United States Patent [19]

Meitzler

[11] Patent Number: 5,173,667
[45] Date of Patent: Dec. 22, 1992

[54] ACOUSTIC WAVE TRANSMISSION MEDIA DELAY LINE HAVING INTERNALLY DISPOSED ABSORBER CHANNELS

[75] Inventor: Allen H. Meitzler, Ann Arbor, Mich.

[73] Assignee: Ford Motor Company, Dearborn, Mich.

[21] Appl. No.: 657,233

[22] Filed: Feb. 19, 1991

[51] Int. Cl.$^5$ .............................................. H03H 9/30
[52] U.S. Cl. .................................... 333/143; 333/151; 310/313 D; 310/326
[58] Field of Search .................................. 333/141-143, 333/153, 147, 151; 310/313 D, 326, 367, 335

[56] References Cited

U.S. PATENT DOCUMENTS

| | | | |
|---|---|---|---|
| 2,839,731 | 6/1958 | McSkimin | 333/143 |
| 2,907,958 | 10/1959 | Skaggs | 333/142 |
| 3,041,556 | 7/1959 | Meitzler | 333/141 |
| 3,259,858 | 7/1966 | Meitzler | 333/147 |
| 3,475,633 | 10/1969 | Stelting | 333/141 X |
| 3,522,557 | 8/1970 | Duncan et al. | 333/143 |
| 3,581,247 | 5/1971 | Belford et al. | 333/142 |
| 3,671,887 | 6/1972 | Gibson | 333/143 |
| 3,680,008 | 7/1972 | Yamamoto | 333/143 |
| 3,745,486 | 7/1973 | Chiron et al. | 333/147 |
| 3,794,937 | 2/1974 | Gottlieb et al. | 333/142 |
| 3,798,577 | 3/1974 | Kasahara et al. | 333/143 |
| 3,942,139 | 3/1976 | Cooper et al. | 333/143 |
| 4,268,808 | 5/1981 | Melngailes | 333/195 |
| 4,349,794 | 9/1982 | Kagiwada et al. | 333/141 |
| 4,447,754 | 5/1984 | Wagers | 310/313 R |
| 4,594,889 | 6/1986 | Mc Carthy | 73/204 |
| 4,609,890 | 9/1986 | Oates et al. | 333/141 X |
| 4,684,906 | 8/1987 | Yokoyama | 333/143 |
| 4,932,255 | 6/1990 | Brace et al. | 73/204.11 |

FOREIGN PATENT DOCUMENTS 8706073 10/1987 PCT Int'l Appl. ................. 333/141

OTHER PUBLICATIONS

S. J. Martin, et al., "Sensing Liquids with SH Plate Mode Devices" 1988 Ultrasonics Symposium Proceedings, vol. 1, pp. 607-611.

Primary Examiner—Paul M. Dzierzynski
Assistant Examiner—Benny Lee
Attorney, Agent, or Firm—Roger May; Peter Abolins

[57] ABSTRACT

A multiple-reflection, long-path wave transmission device is fabricated from a single crystal silicon plate by micromachining straight walled rectangular cavities into the plate to reflect ultrasonic waves along an extended transmission path defined by the rectangular cavities. An input transducer is coupled to the silicon plate to introduce ultrasonic waves into the plate in response to an input signal. The ultrasonic waves travel in the silicon plate along the transmission path defined by the straight walled reflective cavities. An output transducer is similarly coupled to the silicon plate to receive the ultrasonic waves at the completion of the transmission path and to generate an output signal representative thereof. Additional sloped wall cavities are formed in the silicon plate to border the extended transmission path. The sloped wall cavities prevent cross coupling of waves traveling in different portions of the path and absorb energy traveling in undesired directions and modes. The sloped walls may be coated with an absorbing material to enhance absorbtion.

8 Claims, 2 Drawing Sheets

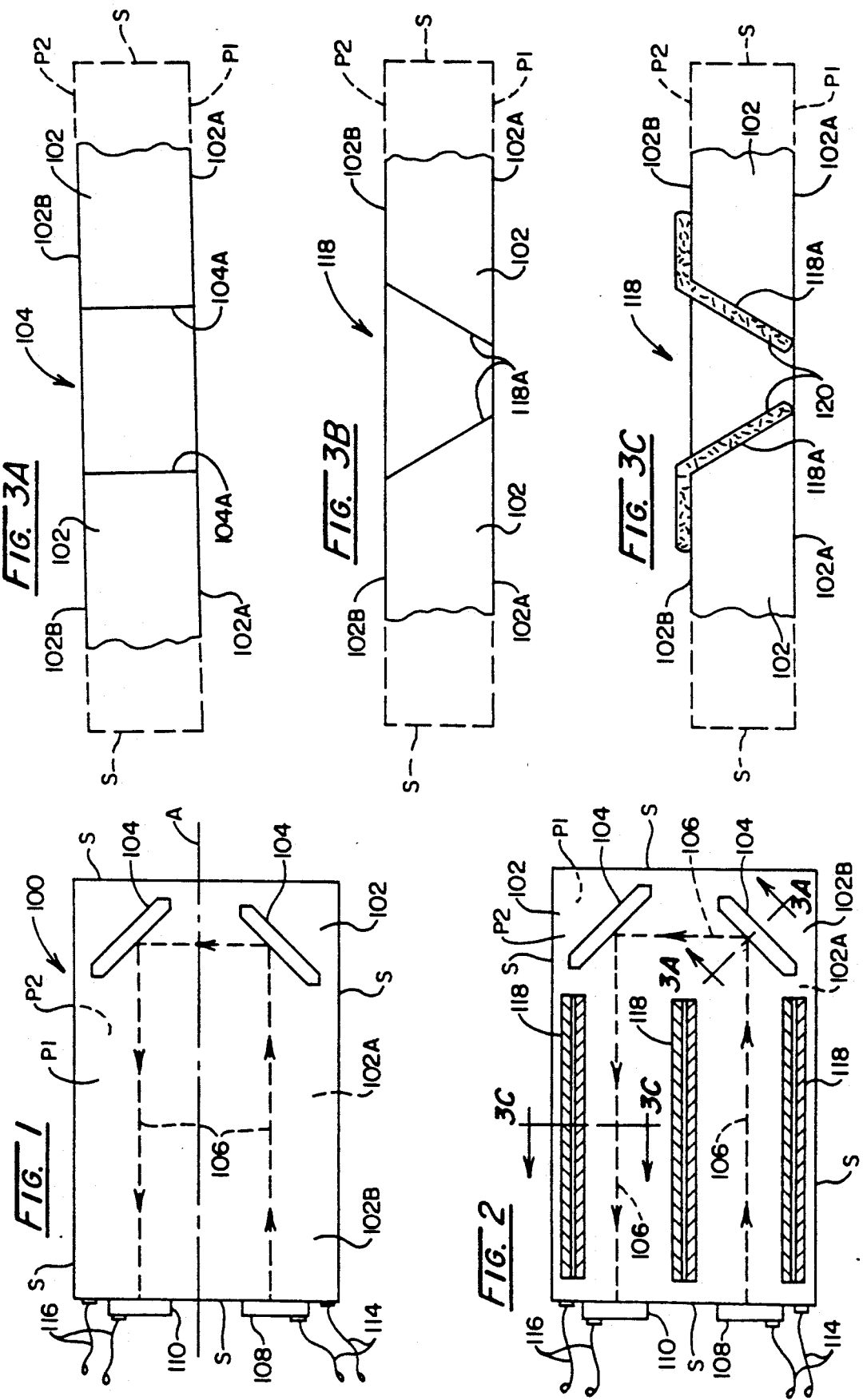

ACOUSTIC WAVE TRANSMISSION MEDIA DELAY LINE HAVING INTERNALLY DISPOSED ABSORBER CHANNELS

BACKGROUND OF THE INVENTION

The present invention relates generally to devices for transmitting ultrasonic waves and, more particularly, to such devices wherein long transmission paths are formed in or on the device by means of micromachined cavities.

Devices for transmitting ultrasonic waves have been used in a number of applications including electromechanical filters and ultrasonic delay lines. Recently, these devices have also been used in sensing viscosity of liquids and, with the proper coatings, the presence or absence of specific gases in gaseous mixtures. In general these devices utilize three different types of wave motions: (1) bulk shear wave motions; (2) high frequency surface wave motions; or (3) Lamb wave motions. The type of wave motion utilized is determined by the design details of the device transducers which are coupled to an ultrasonic wave transmission medium to transmit and receive the ultrasonic waves.

Devices for transmitting ultrasonic waves have been fabricated using a wide variety of materials as wave transmission media. Quartz, silicon and glass are examples of materials used as wave transmission media. The waves usually travel in the medium along a path which may be folded within the medium by reflective surfaces. Folding the path results in a relatively long transmission path in relation to the overall size of the transmission medium.

U.S. Pat. No. 4,684,906 discloses an ultrasonic delay line incorporating a solid wave transmission medium, such as glass. The device takes the form of a polygon with internally reflective surfaces formed on its outer surfaces. An input transducer is disposed on one surface with an output transducer on another of the reflective surfaces. Ultrasonic waves, travel from the input transducer through the medium to reflective surfaces which direct the waves through the medium ultimately to the output transducer to define an extended length path through the medium.

Folded path ultrasonic delay lines, as described in U.S. Pat. No. 3,041,556, also have been fabricated from disks of quartz material. Waves propagate through the disk in a folded path formed by specially oriented reflecting facets. The facets, ground around the edge of the disk, are positioned to reflect the waves back and forth across the major disk surface, thus defining a multiple-reflection, long transmission path.

Folded wave transmission paths have similarly been produced by utilizing reflecting surfaces positioned on the perimeter of a quartz plate. U.S. Pat. No. 3,581,247 discloses a delay line using the exterior surfaces of a polyhedron plate to reflect and guide the wave propagation.

While the known devices provide extended path lengths within a given device, all reflections take place at peripheral edges of the devices. This design is incompatible with the modern technique of batch fabrication developed for semiconductor processing. Accordingly, there is a need for an extended path length device which can be processed by batch fabrication techniques.

SUMMARY OF THE INVENTION

This need is met by the method and apparatus of the present invention wherein a multiple-reflection, long-path wave transmission device is fabricated from a single crystal silicon plate. Straight walled rectangular cavities, micromachined into the silicon plate, reflect ultrasonic waves along an extended transmission path. An input transducer, coupled to a first surface area of the silicon plate, produces ultrasonic waves in the plate in response to an input signal. The ultrasonic waves travel in the silicon plate along a transmission path defined by the straight walled reflective cavities. An output transducer, similarly coupled to a second surface area of the silicon plate, receives the ultrasonic waves at the completion of the transmission path and generates an output signal representative of the received ultrasonic waves. A long-path, wave-transmission device is thus achieved utilizing a single crystal silicon plate with reflective cavities micromachined into the silicon plate and, therefore, differing from prior art arrangements which locate path-defining reflective surfaces on the perimeter of the transmission media.

Preferably, additional cavities having sloped walls are formed in the silicon plate bordering the extended transmission path to prevent cross coupling of waves traveling in different portions of the path and to absorb energy traveling in undesired directions and modes. The ability of the sloped walls of the cavities to absorb unwanted wave motions can be further enhanced by coating the sloped walls with an absorbing material.

In accordance with one aspect of the present invention, a device is provided which is formed in a single crystal silicon plate for transmitting ultrasonic waves via paths formed in the plate. An input transducer for generating ultrasonic waves in response to an input signal is coupled to a first surface area of the silicon plate for launching ultrasonic waves in the silicon plate. An output transducer for receiving ultrasonic waves transmitted through the silicon plate and generating output signals representative of the received ultrasonic waves, is similarly coupled to a second surface area of the silicon plate. A transmission path through the silicon plate originates at the input transducer and terminates at the output transducer. At least one reflector cavity is formed into the silicon plate for diverting ultrasonic waves transmitted by the silicon plate such that the ultrasonic waves travel along the transmission path.

Preferably, the single crystal silicon device may further comprise at least one absorber cavity formed adjacent to at least a portion of the path to isolate ultrasonic waves traveling in the portion of the path from ultrasonic waves traveling in other portions of the path. To enhance operation of the at least one absorber cavity, it may be coated with an ultrasonic wave absorbing material. For optimization of the device, the at least one reflector cavity has walls which are substantially perpendicular to the silicon plate and the at least one absorber cavity has walls which are sloped relative to major faces of the silicon plate. The ultrasonic waves are transmitted either as surface waves, Lamb waves or bulk shear waves through the device.

In accordance with another aspect of the present invention, a method for forming a device in a single crystal silicon plate for transmitting ultrasonic waves via paths defined in the plate comprises the steps of: coupling an input transducer to a first surface area of the silicon plate for launching ultrasonic waves in the silicon plate in response to an input signal applied to the input transducer; coupling an output transducer to a second surface area of the silicon plate for receiving ultrasonic waves transmitted through the silicon plate and generating output signals representative of the received ultrasonic waves; and, forming at least one reflector cavity into the plate for diverting ultrasonic waves transmitted by the silicon plate such that the ultrasonic waves travel along a transmission path through the silicon plate, the transmission path originating at the input transducer, being redirected by said at least one reflector cavity and terminating at the output transducer.

The method of forming a single crystal silicon device for transmitting ultrasonic waves preferably further comprises the step of forming at least one absorber cavity into the plate adjacent at least a portion of the path to isolate ultrasonic waves traveling in the portion of the path from ultrasonic waves traveling in other portions of the path. Preferably, the one or more reflector cavities have a long dimension oriented in a <100> direction of the single crystal silicon plate while the long dimension of the one or more absorber cavities and transmission path segments are oriented in a <110> direction.

It is thus a feature of the present invention to provide a method and apparatus for providing a long-path, single silicon crystal, ultrasonic wave transmission device wherein the path is extended by wave diverting cavities formed into the plate; to provide a method and apparatus for providing a long-path, single silicon crystal, ultrasonic wave transmission device wherein the path is extended by wave diverting cavities formed into the plate with path segments being separated from one another by wave absorber cavities formed along the path; and, to provide a method and apparatus for providing a long-path, single silicon crystal ultrasonic wave transmission device wherein the path is extended by wave diverting cavities formed into the plate with path segments being separated from one another by wave absorber cavities formed along the path and coated with wave absorbing material.

These and other features of the present invention will be apparent from the following description, the accompanying drawings and the appended claims.

BRIEF DESCRIPTION OF THE DRAWINGS

FIG. 1 is a plan view of a multiple-reflection, long-path wave transmission device in accordance with the present invention;

FIG. 2 is a plan view of an alternative embodiment of the device of FIG. 1;

FIG. 3A is a cross sectional view of a straight walled reflector cavity of FIG. 2 taken along the section line 3A;

FIG. 3B is a cross sectional view of a sloped walled absorber cavity;

FIG. 3C is a cross sectional view of a sloped walled absorber cavity coated with a layer of absorbing material as shown in FIG. 2 and taken along the section line 3C.

DETAILED DESCRIPTION OF THE INVENTION

Figure 4:
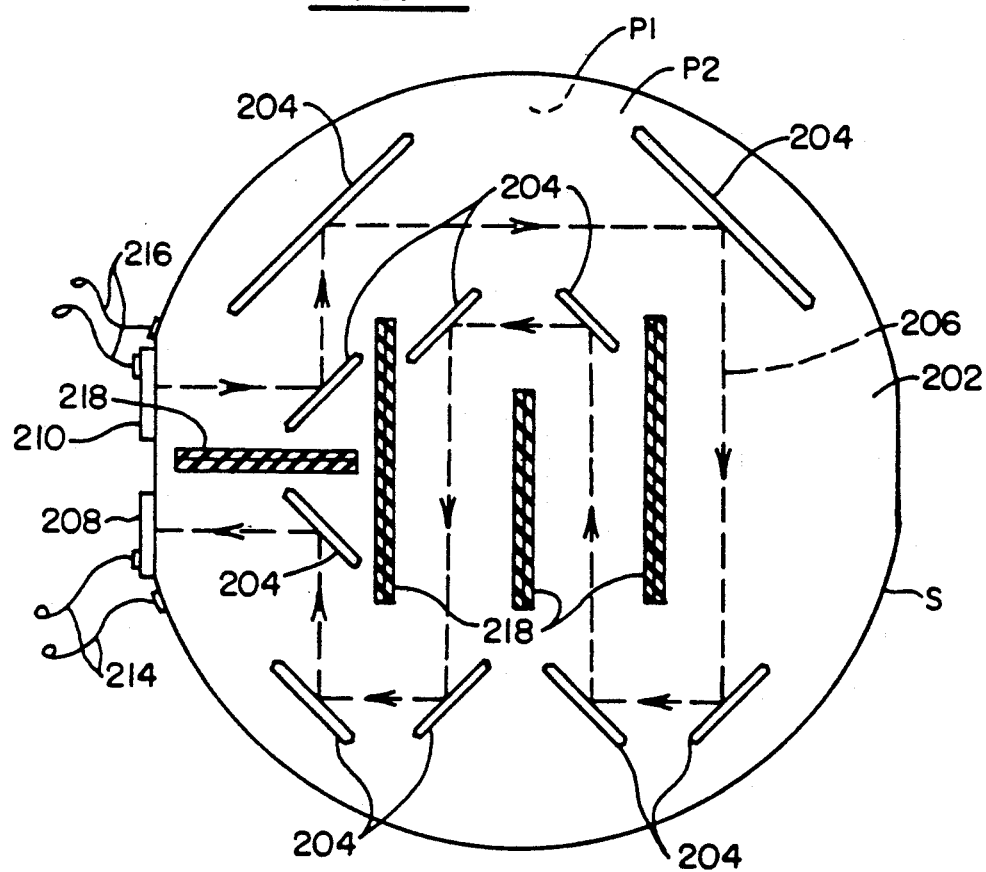
FIG. 4 is a plan view of a multiple-reflection, long-path wave transmission device in accordance with the present invention utilizing an entire silicon wafer.

Reference is now made to the multiple-reflection, long-path wave transmission device 100 in accordance with the present invention illustrated in FIG. 1. The wave transmission device 100 comprises a wave transmission medium fabricated from a thin, silicon plate 102 formed between first and second parallel planes P1 and P2 which are separated from one another by thin sidewalls S. Major face 102A lying in the plane P1 and major face 102B lying in the plane P2 of the silicon plate 102 are (100) faces and the silicon plate 102 is preferably formed in a (100) oriented wafer of single crystal silicon. Straight walled reflector cavities 104, formed in the silicon plate 102 by conventional semiconductor micromachining techniques including the use of an anisotropic etching solution like potassium hydroxide and water or ethylene diamine pyrocatechol and water, guide ultrasonic waves along a predetermined transmission path 106 which originates at an input transducer 108 and terminates at an output transducer 110.

The reflector cavities 104, shown in cross section in FIG. 3A, have vertical walls 104A which are substantially perpendicular to the major silicon plate faces 102A, 102B. As is well known in mechanical wave theory, having the reflector cavity walls 104A normal to the major faces 102A, 102B of the silicon plate 102 and positioning the walls to form 45X° angles with respect to the wave propagation direction as shown in FIG. 1 results in little or no mode conversion occurring upon reflection. The long dimension of the reflector cavities 104 are preferably oriented in the <100> direction in the silicon plate 102. FIG. 1 illustrates a wave transmission path which turns the wave 180X° through the use of two reflector cavities 104; however, other wave transmission path geometries will be apparent to those skilled in the art.

An input signal is received via conductors 114 from an outside source (not shown) by the input transducer 108 which is coupled to a first surface area of the silicon plate 102. The input transducer 108 converts the input signal into ultrasonic wave motions, either bulk shear wave motions, high-frequency surface acoustic wave motions or Lamb wave motions depending upon the design details of the transducer 108. A preferred arrangement for the use of bulk shear wave motions comprises a bar-shaped transducer formed from a piece of piezoelectric ceramic and poled in the direction of the long dimension of the silicon plate 102. An electrical field is applied in the thickness direction of the transducer and this excites a thickness shear wave motion in the silicon plate 102. The direction of propagation of the bulk shear waves is along the length axis A of the silicon plate 102. The particle displacement in the wave motion is perpendicular to the propagation direction and parallel to the major faces 102A, 102B of the silicon plate 102. In the lowest bulk mode of propagation, which mode is usually preferred due to its non-dispersive propagation characteristics, the particle displacement amplitude is uniform across the thickness of the plate 102.

For plates of silicon using surface wave motions, the usual procedure is to form the transducers by depositing finger shaped films of polycrystalline zinc oxide (ZnO) or polycrystalline aluminum nitride (AlN) on top of a thin oxide layer on the surface of the plate. The width of the fingers and their center-to-center spacing controls the surface wave frequency. To reduce loss and increase selectivity, the transducers are likely to have 50 to 200 finger structures. A metal electrode is then deposited on the upper surface of the ZnO film and an interdigitated electrode structure is etched into the metal electrode. Surface shear wave propagation is also along the length axis A of the silicon plate. Since the transducers do not form a part of the present invention and are well known in the art, they will not be further discussed herein.

Ultrasonic waves generated by the input transducer 108 are transmitted through the silicon plate 102. Once in the silicon plate 102, the ultrasonic waves travel along the transmission path 106 defined by reflections from the straight walled reflector cavities 104. The ultrasonic waves continue along the transmission path 106 until reaching the output transducer 110. The output transducer 110 converts the ultrasonic waves into a representative output signal and transmits this output signal to an outside circuit (not shown) via conductors 116.

An alternative embodiment of the present invention utilizing sloped-walled absorber cavities 118 is shown in FIG. 2 wherein the sloped-walled absorber cavities 118 are formed entirely internal to the silicon plate 102, and are separate and apart from the thin sidewalls S. If the long dimensions of the sloped-walled absorber cavities 118 are oriented in a <110> direction in the silicon plate 102, the sloped-walled absorber cavities 118 can be formed simultaneously with the above mentioned reflector cavities 104 using the same micromachining techniques since single crystal silicon is an anisotropic material. The sloped-walled absorber cavities 118, shown in cross section in FIG. 3B, border the wave transmission path 106 to prevent cross-coupling of waves traveling in different sections of the path 106 and to absorb energy traveling in undesired directions and modes.

Preferably, the walls 118A of the absorber cavities 118 form an angle of 54.7X° with respect to the lower face 102A of the silicon plate 102. Further, the absorption capability of the sloped walled absorber cavities 118 can be further enhanced by adhering a wave absorber material 120, like epoxy resin or polyimide compounds, to the walls 118A as best shown in FIG. 3C.

Although the input transducer 108 directs the major portion of the total radiated energy into the main lobe of the radiation pattern, a percentage of the radiated energy diverges from the main lobe. This divergent energy strikes the inclined walls 118A of the absorber cavities 118. At the surfaces 118A, mode conversion occurs upon reflection and there is a tendency for the energy to concentrate at the intersection of the upper face of the silicon plate 102 and the inclined walls 118A. The reflection of the divergent energy upward prohibits this energy from cross coupling with waves in other portions of the transmission path 106. Further, the concentration of the divergent waves provides an excellent opportunity for spurious wave motions to interact with the wave absorber material 120 and be absorbed.

It should be apparent that more complicated transmission path geometries in accordance with the present invention are possible. One such geometry, utilizing a whole silicon wafer 202, is shown in FIG. 4. Elements of the device shown in FIG. 4 and corresponding to the elements of the devices of FIGS. 1-3 are identified by corresponding numbers in the two-hundred series of numbers. Accordingly, the present invention is equally applicable to numerous alternate transmission path geometries. Various modifications of the present invention will no doubt occur to those skilled in the art. For example, semiconductor devices or circuits can be incorporated into the silicon plate 102 in order to sense specific properties, like the temperature of the silicon plate 102. Additionally, chemical compounds which selectively absorb certain species of gases can be applied to the silicon plate 102 to detect the presence and quantities of appropriate gases.

Having thus described the long path, multiple reflection mechanical wave transmission media using micromachined silicon plates of the present invention in detail and by reference to preferred embodiments thereof, it will be apparent that modifications and variations are possible without departing from the scope of the invention defined in the appended claims.

What is claimed is:

1. A device disposed in a single crystal silicon plate for transmitting ultrasonic waves in the plate, said plate having two major faces lying in first and second parallel planes separated from one another by thin sidewalls of the plate and said device comprising:

an input transducer for generating ultrasonic waves in response to an input signal, said input transducer being coupled to a first surface area of said thin sidewalls of said silicon plate for launching said ultrasonic waves in said silicon plate;

an output transducer for receiving said ultrasonic waves transmitted through said silicon plate and generating output signals representative of said received ultrasonic waves, said output transducer being coupled to a second surface area of said thin sidewalls of said silicon plate;

a transmission path through said silicon plate, said transmission path originating at said input transducer and terminating at said output transducer;

at least one reflector cavity for diverting said ultrasonic waves transmitted through said silicon plate such that said ultrasonic waves travel along said path, said at least one reflector cavity extending into said plate from said at least one of said tow major faces of said silicon plate and being located along said transmission path; and at least one absorber cavity located adjacent at least a portion of said transmission path to isolate said ultrasonic waves traveling in said portion of said transmission path from said ultrasonic waves traveling outside of said portion of said transmission path, said at least one absorber cavity being entirely internal to said silicon plate, separate and apart from said thin sidewalls, and having walls which extend inwardly into said plate from said at least one of said two major faces of said silicon plate, said walls of said at least one absorber cavity are sloped relative to said major faces.

2. A device disposed in a single crystal silicon plate for transmitting said ultrasonic waves in the plate as claimed in claim 1 wherein said ultrasonic waves are transmitted as bulk shear waves through said silicon plate.

3. A device disposed in a single crystal silicon plate for transmitting said ultrasonic waves in the plate as claimed in claim 1 wherein said ultrasonic waves are transmitted as Lamb waves through said silicon plate.

4. A device disposed in a single crystal silicon plate for transmitting said ultrasonic waves in the plate as claimed in claim 1 wherein said at least one absorber cavity comprises a coating of an ultrasonic wave absorbing material.

5. A device disposed in a single crystal silicon plate for transmitting said ultrasonic waves in the plate as claimed in claim 1 wherein said ultrasonic waves are transmitted as surface waves upon a surface of one of said major faces of said silicon plate.

6. A device disposed in a single crystal silicon plate for transmitting said ultrasonic waves in the plate as claimed in claim 1 wherein said at least one reflector cavity has walls which are substantially perpendicular to said major faces of said silicon plate.

7. A method of forming a device in a single crystal silicon plate for transmitting ultrasonic waves in the plate, said plate having two major faces lying in first and second parallel planes separated from one another by thin sidewalls of the plate and said method comprising the steps of:

coupling an input transducer to a first surface area of said thin sidewalls of said silicon plate for launching said ultrasonic waves in said silicon plate in response to an input signal applied to said input transducer;

coupling an output transducer to a second surface area of said thin sidewalls of said silicon plate for receiving said ultrasonic waves transmitted through said silicon plate and generating output signals representative of said received ultrasonic waves;

forming at least one reflector cavity into said plate for diverting said ultrasonic waves transmitted through said silicon plate such that said ultrasonic waves travel along a transmission path through said silicon plate, said transmission path originating at said input transducer, terminating at said output transducer and being defined by reflection from said at least one reflector cavity; and forming at least one absorber cavity adjacent at least a portion of said transmission path to isolate said ultrasonic waves traveling in said portion of said transmission path from said ultrasonic waves traveling outside of said portion of said transmission path by disposing said at least one absorber cavity entirely internal to said silicon plate, separate and apart from said thin sidewalls, and having walls which extend into said plate from said at least one of said two major faces of said silicon plate, said walls of said at least one absorber cavity are sloped relative to said two major faces of said silicon plate.

8. A method of forming a device in a single crystal silicon plate for transmitting said ultrasonic waves in the plate as claimed in claim 7 wherein said step of forming said at least one reflector cavity comprises forming said at least one reflector cavity to have walls which are substantially perpendicular to said major faces of said silicon plate.

* * * * *

UNITED STATES PATENT AND TRADEMARK OFFICE
CERTIFICATE OF CORRECTION

PATENT NO. : 5,173,667
DATED : December 22, 1992
INVENTOR(S) : Allen H. Meitzler It is certified that error appears in the above-identified patent and that said Letters Patent is hereby corrected as shown below:

Col. 4, line 29, "45X°" should be --45°--.
Col. 4, line 35, "180X° should be --180°--.
Col. 5, line 39, "54.7X° should be --54.7°--.
Col. 6, line 41, "said tow" should be --said two--.

Signed and Sealed this

Ninth Day of November, 1993

Attest:

BRUCE LEHMAN

*Attesting Officer*  *Commissioner of Patents and Trademarks*